(12) United States Patent
Sakaguchi

(10) Patent No.: US 11,387,825 B2
(45) Date of Patent: Jul. 12, 2022

(54) OVERHEAT PROTECTION CIRCUIT AND SEMICONDUCTOR DEVICE INCLUDING THE SAME

(71) Applicant: ABLIC Inc., Chiba (JP)

(72) Inventor: Kaoru Sakaguchi, Chiba (JP)

(73) Assignee: ABLIC INC., Chiba (JP)

(*) Notice: Subject to any disclaimer, the term of this patent is extended or adjusted under 35 U.S.C. 154(b) by 63 days.

(21) Appl. No.: 16/689,687

(22) Filed: Nov. 20, 2019

(65) Prior Publication Data
US 2020/0177174 A1   Jun. 4, 2020

(30) Foreign Application Priority Data
Nov. 30, 2018 (JP) ............................ JP2018-224786

(51) Int. Cl.
| | |
|---|---|
| H03K 17/082 | (2006.01) |
| H03K 17/08 | (2006.01) |
| H02H 7/12 | (2006.01) |
| H01L 27/02 | (2006.01) |
| H02H 5/04 | (2006.01) |
| H03K 17/0812 | (2006.01) |

(52) U.S. Cl.
CPC .......... *H03K 17/0822* (2013.01); *H01L 27/02* (2013.01); *H02H 5/04* (2013.01); *H02H 7/12* (2013.01); *H03K 17/082* (2013.01); *H03K 17/0812* (2013.01); *H03K 2017/0806* (2013.01)

(58) Field of Classification Search
CPC ............. H03K 17/082; H03K 17/0822; H03K 2017/0806; H03K 17/0812; H03K 17/08104; H03K 17/08122; H02H 5/04; H02H 7/12; H02H 9/00; H01L 27/02
USPC ........................................ 361/93.7–93.9, 103
See application file for complete search history.

(56) References Cited

U.S. PATENT DOCUMENTS

| | | | | |
|---|---|---|---|---|
| 2002/0149350 | A1* | 10/2002 | Koyasu | ................... G05F 1/565 323/274 |
| 2008/0278868 | A1* | 11/2008 | Morino | ................... G05F 1/573 361/18 |
| 2015/0263507 | A1* | 9/2015 | Endo | ....................... G05F 1/567 361/18 |
| 2019/0279977 | A1* | 9/2019 | Ma | ....................... H01L 27/0277 |

FOREIGN PATENT DOCUMENTS

JP    2008-282118 A    11/2008

* cited by examiner

*Primary Examiner* — Danny Nguyen
(74) *Attorney, Agent, or Firm* — Crowell & Moring LLP

(57) ABSTRACT

An overheat protection circuit includes a first constant current source which supplies a first constant current to a temperature sensitive element, a first transistor provided between the temperature sensitive element and the first constant current source, an output current detection circuit which controls a gate voltage of the first transistor by a voltage based on a sense current corresponding to an output current of a semiconductor device, and an output circuit which supplies an overheat detection signal based on a result of comparison between a temperature sensitive current and the first constant current.

4 Claims, 3 Drawing Sheets

OVERHEAT PROTECTION CIRCUIT AND SEMICONDUCTOR DEVICE INCLUDING THE SAME

RELATED APPLICATIONS

This application claims priority to Japanese Patent Application No. 2018-224786 filed on Nov. 30, 2018, the entire content of which is incorporated herein by reference.

BACKGROUND OF THE INVENTION

1. Field of the Invention

The present invention relates to an overheat protection circuit and a semiconductor device including the same.

2. Description of the Related Art

A semiconductor device having a self-heated output transistor generally includes an overheat protection circuit. The overheat protection circuit measures a temperature of the semiconductor device and stops the operation of the output transistor where the measured temperature exceeds a prescribed overheat detection temperature, to suppress overheat of the semiconductor device. Degradation of the reliability of the semiconductor device due to heat can be prevented by the above operation of the overheat protection circuit.

Regarding the semiconductor device having such an overheat protection circuit, there is known a technique of supplying a bias current to a temperature detecting means of the overheat protection circuit where the output transistor supplies an output current of a prescribed current value or greater, thereby reducing current consumption. This technique has been disclosed in, for example, Japanese Patent Application Laid-Open No. 2008-282118.

SUMMARY OF THE INVENTION

However, in the overheat protection circuit disclosed in Japanese Patent Application Laid-Open No. 2008-282118, it is difficult to perform a further reduction in current consumption because the bias current is always supplied to a comparator. A response speed of the comparator is reduced where the bias current of the comparator is made small.

The present invention has been made in view of the above circumstances, and it is an object of the present invention to provide an overheat protection circuit reduced in current consumption without reducing a response speed, and a semiconductor device including the same.

An overheat protection circuit according to one aspect of the present invention includes a temperature sensitive element which makes flow a temperature sensitive current corresponding to a temperature of a semiconductor device, a first constant current source which supplies a first constant current to the temperature sensitive element, a first transistor provided between the temperature sensitive element and the first constant current source, an output current detection circuit which controls a gate voltage of the first transistor by a voltage based on a sense current corresponding to an output current of the semiconductor device, and an output circuit which supplies an overheat detection signal based on a result of comparison between the temperature sensitive current and the first constant current.

A semiconductor device according to one aspect of the present invention includes an output transistor, a drive circuit which supplies a control voltage to a gate of the output transistor, and the overheat protection circuit according to one aspect of the present invention which controls a gate voltage of the Output transistor according to the control voltage of the drive circuit.

According to an overheat protection circuit of the present invention and a semiconductor device including the same, current consumption can be reduced without lowering a response speed because a current flowing through the overheat protection circuit is reduced depending on an output current of an output transistor

DETAILED DESCRIPTION OF THE PREFERRED EMBODIMENTS

Preferred embodiments of the present invention will hereinafter be described with reference to the accompanying drawings.

Figure 1:
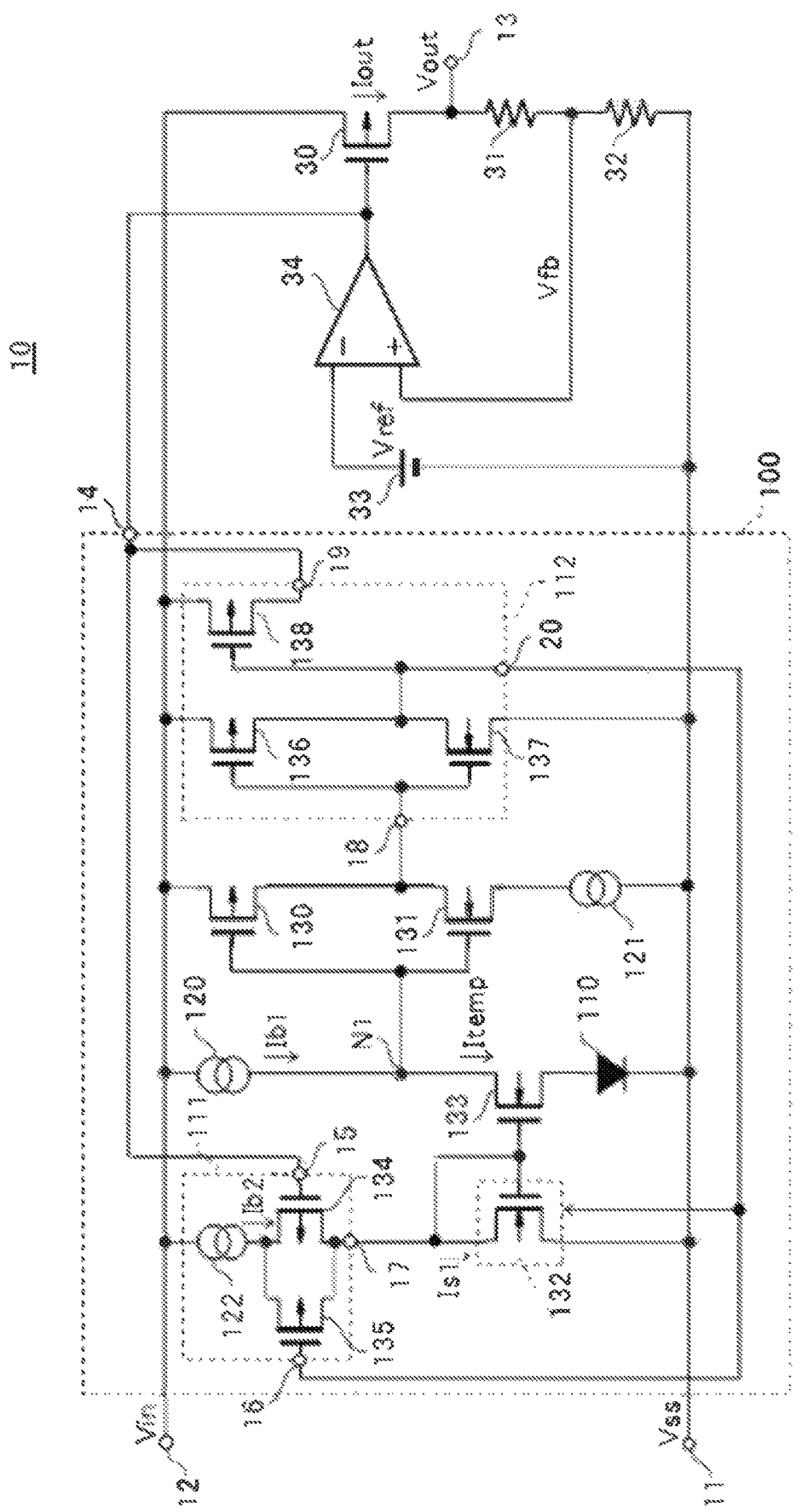
FIG. 1 is a circuit diagram for illustrating a configuration example of a semiconductor device of an embodiment according to the present invention.

FIG. 1 is a circuit diagram for illustrating a configuration example of a semiconductor device according to an embodiment of the present invention.

A semiconductor device 10 includes an output transistor 30, resistors 31 and 32, a reference voltage circuit 33, an error amplifier 34, and an overheat protection circuit 100 serving as an overheat protection circuit according to an embodiment of the present invention. The resistors 31 and 32 are connected in series. The resistors 31 and 32, the reference voltage circuit 33, and the error amplifier 34 constitute a drive circuit of the output transistor 30.

The overheat protection circuit 100 includes a diode 110 as a temperature sensitive element, an output current detection circuit 111, a control circuit 112, constant current sources 120 and 121, a PMOS transistor 130, NMOS transistors 131 and 133, and an NMOS transistor 132 containing an adjustment terminal. The output current detection circuit 111 includes PMOS transistors 134 and 135, and a constant current source 122. The control circuit 112 includes PMOS transistors 136 and 138, and an NMOS transistor 137.

A description will be made as to the connections of the respective components of the semiconductor device 10.

The output transistor 30 contains a gate connected to an input/output terminal 14 of the overheat protection circuit 100, a source connected to a power supply terminal 12 of the overheat protection circuit 100, and a drain connected to an output terminal 13 of the semiconductor device 10. It is noted that the power supply terminal 12 is also configured as a power supply terminal of the semiconductor device 10. The resistor 31 and the resistor 32 are connected between the output terminal 13 and a ground terminal 11. In the error amplifier 34, a non-inversion input terminal thereof is connected to a node of the resistor 31 and the resistor 32. An inversion input terminal thereof is connected to an output terminal of the reference voltage circuit 33. An output terminal of the error amplifier 34 is respectively connected to the gate of the output transistor 30 and the input/output terminal 14.

In the output current detection circuit 111, a first input terminal 15 thereof is connected to the input/output terminal 14. A second input terminal 16 thereof is connected to a second output terminal 20 of the control circuit 112. An output terminal 17 thereof is connected to a gate and a drain of the NMOS transistor 132 and a gate of the NMOS transistor 133. A source of the NMOS transistor 132 is connected to the ground terminal 11. The NMOS transistor 133 contains a source connected to an anode of the diode 110, and a drain connected to a first terminal of the constant current source 120 and gates of the PMOS transistor 130 and the NMOS transistor 131. A cathode of the diode 110 is connected to the ground terminal 11. A second terminal of the constant current source 120 is connected to the power supply terminal 12. The PMOS transistor 130 contains a source connected to the power supply terminal 12, and a drain connected to a drain of the NMOS transistor 131 and an input terminal 18 of the control circuit 112. The constant current source 121 contains a first terminal connected to a source of the NMOS transistor 131, and a second terminal connected to the ground terminal 11. The control circuit 112 further includes the input terminal 18, a first output terminal 19 connected to the input/output terminal 14, and a second output terminal 20 connected to the adjustment terminal of the NMOS transistor 132.

The PMOS transistor 134 contains a gate connected to the first input terminal 15, a source connected to a first terminal of the constant current source 122 and a source of the PMOS transistor 135, and a drain connected to the output terminal 17 and a drain of the PMOS transistor 135. A gate of the PMOS transistor 135 is connected to the second input terminal 16. A second terminal of the constant current source 122 is connected to the power supply terminal 12.

The PMOS transistor 136 contains a gate connected to a gate of the NMOS transistor 137 and the input terminal 18, and a drain connected to a drain of the NMOS transistor 137, a gate of the PMOS transistor 138, and the second output terminal 20. The PMOS transistor 136 further contains a source connected to the power supply terminal 12. A source of the NMOS transistor 137 is connected to the ground terminal 11. The PMOS transistor 138 contains a drain connected to the first output terminal 19 of the control circuit 112, and a source connected to the power supply terminal 12.

Here, in the NMOS transistor 132, a W/L indicative of a ratio between a W length thereof and an L length thereof is assumed to be adjusted according to a signal supplied to the adjustment terminal.

A description will be made below as to the operation of the semiconductor device 10.

The reference voltage circuit 33 supplies a constant reference voltage Vref with a voltage Vss of the ground terminal 11 as a reference. The error amplifier 34 controls a gate voltage of the output transistor 30 in such a manner that a voltage Vfb coincides with the reference voltage Vref. As a result, a voltage Vout of the output terminal 13 is controlled to be a prescribed voltage based on the reference voltage Vref.

In the diode 110 being biased in the forward direction, a forward voltage Vf generated across the diode 110 has a negative temperature coefficient of about −2 mV/° C. with respect to a junction temperature of the semiconductor device 10.

An output voltage of the error amplifier 34 is a voltage corresponding to an output current Iout of the output transistor 30, and applied to the first input terminal 15. The output voltage is applied to the gate of the PMOS transistor 134 through the first input terminal 15. The output current detection circuit 111 supplies a first sense current, i.e., a sense current Is1 proportional to the output current Iout of the output transistor 30 to the drain of the NMOS transistor 132.

The PMOS transistor 134 supplies the sense current Is1 proportional to the output current Iout of the output transistor 30 to the output terminal 17. The sense current Is1 is saturated at a constant current value Ib2 made to flow by the constant current source 122 where a signal indicative of an overheat detection state, i.e., an L level is not supplied to the second input terminal 16.

In the NMOS transistor 132, the sense current Is1 is generated at the gate. The NMOS transistor 132 supplies a sense voltage Vs1 based on the sense current Is1 to the gate of the NMOS transistor 133. Here, the sense voltage Vs1 continuously changes according to the sense current Is1 proportional to a change in the output current Iout.

Since the sense current Is1 is also small in proportion to the output current Iout where the output current Iout is small, the sense voltage Vs1 becomes low. Upon the sense voltage Vs1 being low, a temperature sensitive current Itemp flowing through the diode 110 connected in series with the NMOS transistor 133 becomes a very small value. Upon the temperature sensitive current Itemp being smaller than a constant current Ib1 provided from the constant current source 120, a node N1 between the constant current source 120 and the NMOS transistor 133 is fixed to a power supply voltage Vin by the constant current Ib1. Since the PMOS transistor 130 is turned OFF, and the NMOS transistor 131 is turned ON upon the voltage of the node N1 being at a power supply voltage Vin level, the voltage Vss of the ground terminal 11, a voltage of an L level is applied to the input terminal 18 of the control circuit 112. That is, an overheat non-detection state is brought about.

Since the PMOS transistor 136 is turned ON upon the signal of the L level being applied to the input terminal 18 in the control circuit 112 serving as an output circuit of the overheat protection circuit 100, the voltage of the second output terminal 20 becomes an H level, and hence the first output terminal 19 becomes an open state. Thus, in the output current detection circuit 111, a voltage of the input/output terminal 14 is applied to the first input terminal 15, and the H level is applied to the second input terminal 16. Then, the output current detection circuit 111 supplies the sense current Is1 proportional to the output current Iout of the output transistor 30 to the output terminal 17.

Since the sense current Is1 is also large in proportion to the output current Iout where the output current Iout is large, the sense voltage Vs1 becomes high. Here, since the forward voltage Vf of the diode 110 is high where the junction temperature of the semiconductor device 10 is lower than a prescribed overheat detection temperature, the temperature sensitive current Itemp made to flow by the NMOS transistor 133 becomes a very small value. The input terminal 18 of the control circuit 112 is supplied with the voltage of the L level because the temperature sensitive current Itemp is smaller than the constant current Ib1 as with the case where the output current Iout is small.

Since the forward voltage Vf of the diode 110 becomes low where the sense voltage Vs1 is high and the junction temperature of the semiconductor device 10 is higher than the prescribed overheat detection temperature, the temperature sensitive current Itemp made to flow by the NMOS transistor 133 becomes a large value. The voltage of the node N1 is lowered where the temperature sensitive current Itemp is larger than the constant current Ib1. Upon the voltage of the node N1 being lowered, and the PMOS transistor 130 being turned ON, the input terminal 18 of the control circuit 112 is supplied with the voltage Vin of the power supply terminal 12, i.e., the voltage of the H level. That is, an overheat detection state is brought about.

So long as the PMOS transistor 130 is turned ON, the input terminal of the control circuit 112 becomes the H level by the PMOS transistor 130 because current capability of the NMOS transistor 131 is limited by the constant current source 121 even in the case where the NMOS transistor 131 is not turned OFF.

In the overheat non-detection state, the control circuit 112 does not control the gate of the output transistor 30 in the state in which the first output terminal 19 is in the open state. Further, the control circuit 112 supplies the signal of the H level from the second output terminal 20 to the second input terminal 16 of the output current detection circuit 111 and the adjustment terminal of the NMOS transistor 132. Then, the output current detection circuit 111 supplies the sense current Is1 proportional to the output current Iout to the NMOS transistor 132 because the PMOS transistor 135 is turned OFF. Further, in the NMOS transistor 132, a W/L thereof is set to a prescribed W/L in the overheat non-detection state.

In the overheat detection state, the control circuit 112 supplies the voltage of the H level from the first output terminal 19 to the gate of the output transistor 30 to turn OFF the output transistor 30, thereby suppressing overheat of the semiconductor device 10. Further, the control circuit 112 supplies the signal of the L level from the second output terminal 20 to the second input terminal 16 of the output current detection circuit 111 and the adjustment terminal of the NMOS transistor 132. Then, the output current detection circuit 111 supplies the constant current value Ib2 made to flow by the constant current source 122 to the NMOS transistor 132 as the sense current Is1 because the PMOS transistor 135 is turned ON. It is therefore possible to continue to detect overheat as is the case with the output current Iout being large, even if the output transistor 30 is turned OFF so that the output current Iout is reduced in the overheat detection state.

Further, in the NMOS transistor 132, the W/L is set to a prescribed W/L in the overheat detection state. Here, the W/L in the overheat detection state, of the NMOS transistor 132 is set to be smaller than that in the overheat non-detection state. That is, the overheat detection temperature is set lower in the overheat non-detection state than in the overheat detection state. This setting of the overheat detection temperature gives the overheat protection circuit 100 a hysteresis as to the overheat detection temperature. As described above, since the overheat protection circuit 100 has the hysteresis in the vicinity of the overheat detection temperature, the semiconductor device 10 can be prevented from being unstable in state transition of the overheat detection state and the overheat non-detection state.

Further, since the overheat protection circuit 100 has such a circuit configuration, current consumption thereof in the overheat non-detection state is determined depending on the sense current Is1 and the temperature sensitive current Itemp. That is, since the sense current Is1 and the temperature sensitive current Itemp are small in the overheat non-detection state and where the output current Iout is small, the current consumption of the overheat protection circuit 100 becomes very small.

Then, since the sense current Is1 is also large where the output current Iout is large, a delay time at the time of overheat detection becomes short. It is therefore possible to provide an overheat protection circuit reduced in current consumption without lowering its response speed, and a semiconductor device including the same.

Incidentally, the output current detection circuit 111 includes the constant current source 122 and is constituted in such a manner that the sense current Is1 is saturated at the constant current value Ib2, but the output current detection circuit 111 may not include the constant current source 122 where it is desired to increase a change in the overheat detection temperature relative to the output current Iout.

Further, although the present embodiment has been described by taking for example, such a constant voltage circuit that the voltage $V_{OUT}$ of the output terminal 13 becomes the constant voltage, the overheat protection circuit 100 of the present embodiment can be applied even to other semiconductor devices each containing the output transistor 30.

Figure 2:
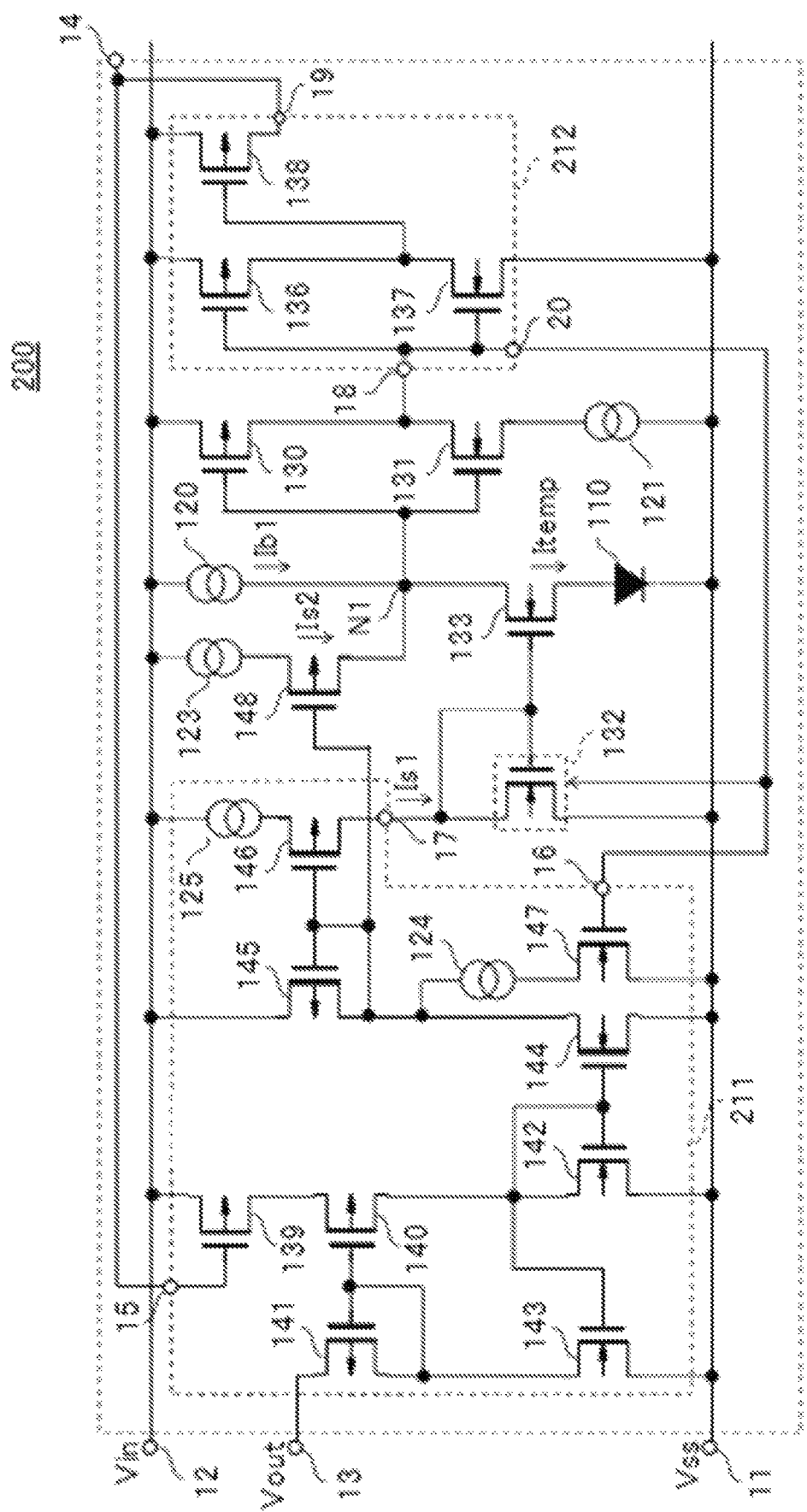
FIG. 2 is a circuit diagram for illustrating a second configuration example of an overheat protection circuit according to the present embodiment.

FIG. 2 is a circuit diagram describing a second configuration example of the overheat protection circuit of the present embodiment. In the circuit diagram of FIG. 2, configurations similar to those illustrated in FIG. 1 are denoted by the same reference numerals, and their detailed description will be omitted.

The overheat protection circuit 200 is constituted to add a constant current source 123 and a PMOS transistor 148 to the constituent elements of the overheat protection circuit 100 and include an output current detection circuit 211 in place of the output current detection circuit 111 and a control circuit 212 in place of the control circuit 112. That is, the control circuit 212 performs as an Output circuit of the overheat protection circuit 200.

The output current detection circuit 211 includes PMOS transistors 139, 140, 141, 145, and 146, NMOS transistors 142, 143, 144, and 147, and constant current sources 124 and 125.

The PMOS transistor 139 has a gate connected to a first input terminal 15 of the output current detection circuit 211. A source of the PMOS transistor 139 is connected to a power supply terminal 12. A drain of the PMOS transistor 139 is connected to a source of the PMOS transistor 140. The PMOS transistor 140 has a gate connected to a gate and a drain of the PMOS transistor 141 and a drain of the NMOS transistor 143. A drain of the PMOS transistor 140 is connected to a gate and a drain of the NMOS transistor 142, a gate of the NMOS transistor 143, and a gate of the NMOS transistor 144. A source of the PMOS transistor 141 is connected to the output terminal 13 of the semiconductor device 10. Respective sources of the NMOS transistors 142, 143, and 144 are connected to a ground terminal 11. In the PMOS transistor 145, a source thereof is connected to the power supply terminal 12. A gate and a drain of the PMOS transistor 145 are connected to a drain of the NMOS transistor 144, one terminal of the constant current source 124, and a gate of the PMOS transistor 146. The other terminal of the constant current source 124 is connected to a drain of the NMOS transistor 147. In the NMOS transistor 147, a gate thereof is connected to a second input terminal 16 of the output current detection circuit 211. A source of the NMOS transistor 147 is connected to the ground terminal 11. In the PMOS transistor 146, a source thereof is connected to one terminal of the constant current source 125. A drain of the PMOS transistor 146 is connected to an output terminal 17 of the output current detection circuit 211. The other terminal of the constant current source 125 is connected to the power supply terminal 12.

In the constant current source 123, one terminal thereof is connected to the power supply terminal 12, and the other terminal thereof is connected to a source of the PMOS transistor 148. In the PMOS transistor 148, a gate thereof is connected to the gate of the PMOS transistor 145. A drain of the PMOS transistor 148 is connected to a node N1. A second output terminal 20 of the control circuit 212 is connected to an input terminal 18 of the control circuit 212.

The operation of the overheat protection circuit 200 will be described.

A second sense current supplied from the PMOS transistor 148, i.e., a sense current Is2 is proportional to an output current Iout of the output transistor 30 and saturated with a constant current made to flow by the constant current source 123.

A voltage of the node N1 changes based on a result of comparison between a current corresponding to the sum of a constant current Ib1 supplied from a constant current source 120 and the sense current Is2, and a temperature sensitive current Itemp. The operation of the overheat protection circuit 200 at this time is similar to that of the previously-mentioned overheat protection circuit 100.

In the overheat protection circuit 100, the constant current Ib1 is constant. On the other hand, in the overheat protection circuit 200, since the temperature sensitive current Itemp and the sense current Is2 subject to be compared both change in correlation with respect to the output current Iout, a change in the overheat detection temperature with respect to the output current Iout is small. Further, in the overheat protection circuit 200, since the impedance of the node N1 is reduced with an increase in the sense current Is2 where the output current Iout is large, the voltage of the node N1 becomes hard to change with respect to noise, so that that the operation of the overheat protection circuit is stabilized.

As described above, in the overheat protection circuit according to the embodiment of the present invention and the semiconductor device including the same, the use of the overheat protection circuit 200 makes it possible to suppress the change in the overheat detection temperature relative to the change in the output current Iout and enhance noise resistance in addition to the effect of the overheat protection circuit 100.

A description will next be made as to the operation of the output current detection circuit 211.

The PMOS transistor 139 supplies a current proportional to the output current Iout of the output transistor 30. The current is supplied to the NMOS transistor 142 through the PMOS transistor 140. The NMOS transistors 143 and 144 current-mirror connected with the NMOS transistor 142 respectively supply a current proportional to an input current of the NMOS transistor 142. By designing gate-source voltages of the PMOS transistors 140 and 141 so as to coincide with each other, a source voltage of the PMOS transistor 140 becomes approximately equal to a voltage Vout of the output terminal 13. In consequence, source-drain voltages of the PMOS transistor 139 and the output transistor 30 become approximately equal to each other, and the PMOS transistor 139 is capable of supplying the current proportional to the output current Iout with satisfactory accuracy without depending on a power supply voltage Vin.

The current provided from the NMOS transistor 144 is supplied to the PMOS transistor 145. The PMOS transistors 146 and 148 current-mirror connected with the PMOS transistor 145 respectively output a current proportional to the input current of the PMOS transistor 145. A sense current Is1 supplied from the PMOS transistor 146 to the output terminal 17 is proportional to the output current Iout of the output transistor 30 and is saturated with a current of the constant current source 125.

Since the NMOS transistor 147 is turned OFF upon a signal of an L level indicative of an overheat non-detection state being applied to the second input terminal 16, the current supplied from the NMOS transistor 144 is supplied to the PMOS transistor 145.

Since the NMOS transistor 147 is turned ON upon a signal of an H level indicative of an overheat detection state being applied to the second input terminal 16, a current of the constant current source 124 is supplied to the PMOS transistor 145. At this time, the sense current Is1 supplied to the output terminal 17 becomes the current of the constant current source 125. Here, the constant current source 124 is provided to limit the current which flows upon turning ON the NMOS transistor 147.

As described above, the overheat protection circuit 200 is capable of reducing dependency of the overheat detection temperature on the power supply voltage because the PMOS transistor 139 is capable of supplying the sense current proportional to the output current Iout which does not depend on the power supply voltage Vin.

Incidentally, it is enough for the constant current source 122 of the output current detection circuit 111 and the constant current sources 123 and 125 of the output current detection circuit 211 to have a function of liming the current. Alternatively, they may respectively be constituted of resistors.

Figure 3:
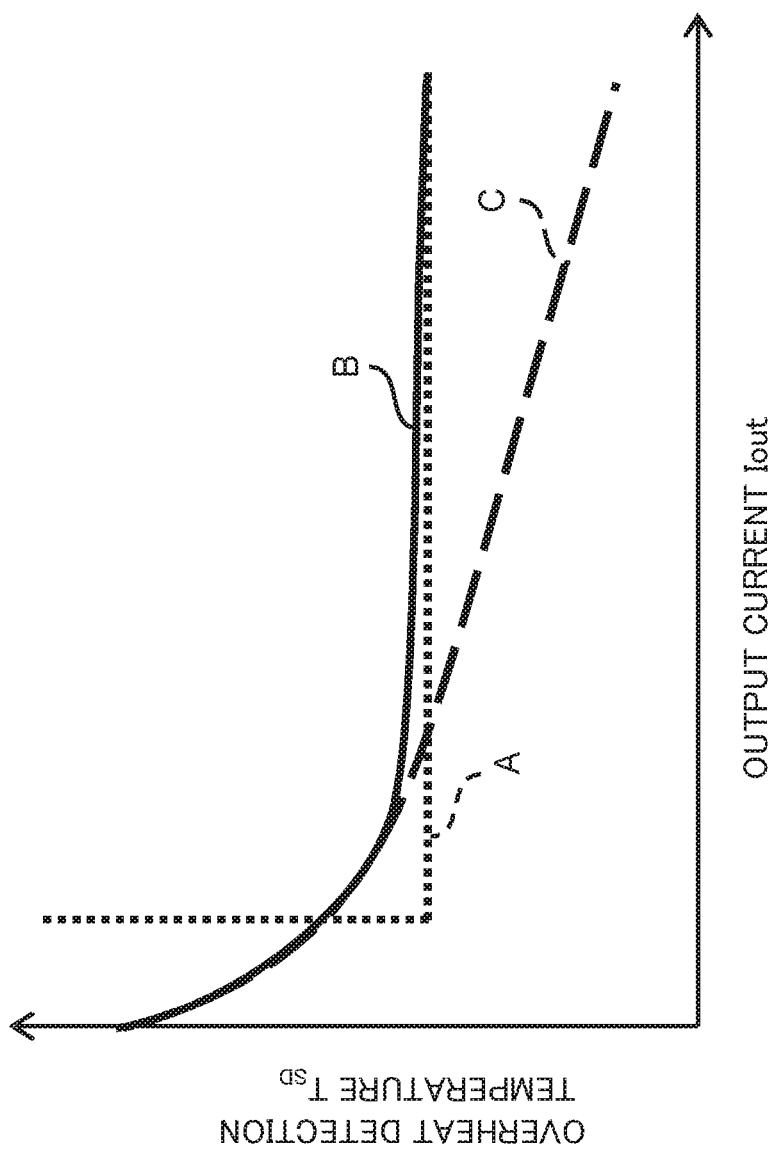
FIG. 3 is a graph for illustrating the characteristics of the overheat protection circuit according to the present embodiment.

FIG. 3 is a graph describing the characteristics of an output current and an overheat detection temperature in the overheat protection circuit of the present embodiment. In FIG. 3, the horizontal axis indicates an output current Iout of the output transistor 30, and the vertical axis indicates an overheat detection temperature $T_{SD}$.

A dotted line A in the present figure indicates the characteristics of an output current and an overheat detection temperature in the related art overheat protection circuit. The related art overheat protection circuit does not perform overheat detection where the output current is not greater than the prescribed output current value, but performs overheat detection at a constant temperature where the output current is greater than the prescribed output current.

A solid line B indicates the characteristics of the output current and the overheat detection temperature in the respective overheat protection circuits 100 and 200. The overheat detection temperature becomes high in a region in which the output current Iout is small, as the output current Iout becomes smaller, and becomes substantially constant in a region in which the output current Iout is large. Since the overheat detection is not stopped in the region in which the output current Iout is small, it is possible to enhance the reliability of the semiconductor device. Such characteristics can be obtained by allowing the sense current Is1 supplied from the output current detection circuit 111 to be saturated at the prescribed output current value or more.

A broken line C indicates the characteristics of the output current and the overheat detection temperature in each of the overheat protection circuits using the resistors in place of the constant current source 122 of the output current detection circuit 111 and the constant current sources 123 and 125 of the output current detection circuit 211 in the overheat protection circuits 100 and 200 illustrated in FIGS. 1 and 2. The overheat detection temperature becomes high in the region in which the output current Iout is small, as the output current Iout becomes smaller, and is gradually reduced in the region in which the output current Iout is large. Since a detection speed at the time of rapid heat generation becomes fast in the region in which the output current Iout is large, it is possible to suppress the semiconductor device from becoming high in temperature and further enhance the reliability of the semiconductor device.

The overheat detection temperature $T_{SD}$ in the semiconductor device of the embodiment of the present invention approximately follows the following equation (1).

$$T_{SD} = \left(\frac{dV_f}{dT}\right)^{-1} \times \left(\sqrt{\frac{Is1}{K_{132}}} - \sqrt{\frac{Ib1}{K_{133}}} - V_{f0}\right) \quad (1)$$

where T is a junction temperature of the semiconductor device, Vf is a forward voltage of a diode, Is1 is a sense current, Ib1 is a constant current, and $V_{f0}$ is a constant indicative of the forward voltage of the diode at a reference temperature. $K_{132}$ and $K_{133}$ are respectively proportional constant K values of drain currents of the NMOS transistors 132 and 133.

The target overheat detection temperature $T_{SD}$ and the dependency thereof on the output current Iout can arbitrarily be determined by adjusting design constants of the respective constituent elements of the overheat protection circuit. For example, the overheat detection temperature $T_{SD}$ at the specific output current Iout can be changed by changing the W/L of the NMOS transistors 132 and 133. Further, the dependency of the overheat detection temperature $T_{SD}$ on the output current Iout can be adjusted by adjusting a current ratio of the sense current Is1 to the output current Iout.

It is noted that the present invention is not limited to the above-described embodiments as they are and, in an implementation phase, can be embodied in various forms other than the specific embodiments described above. Various omissions, additions, substitutions, and changes may be made without departing from the spirit and scope of the invention. These embodiments and modifications thereof are included within the sprit and scope of the invention and are included within the scope of the invention as disclosed in the claims and equivalents thereof.

What is claimed is:

1. An overheat protection circuit configured to protect a semiconductor device from overheat, comprising:
    a temperature sensitive element configured to make a temperature sensitive current corresponding to a temperature of the semiconductor device flow;
    a first constant current source configured to supply a first constant current to the temperature sensitive element;
    a first transistor provided between the temperature sensitive element and the first constant current source;
    an output current detection circuit configured to control a gate voltage of the first transistor by a voltage based on a sense current corresponding to an output current of the semiconductor device; and
    an output circuit configured to supply an overheat detection signal based on a result of comparison obtained by an inverter circuit having an input terminal connected to a connection point between the first constant current source and the first transistor, wherein the inverter circuit compares the temperature sensitive current and the first constant current.

2. The overheat protection circuit according to claim 1, wherein the output current detection circuit includes a second transistor containing a gate supplied with a voltage corresponding to the output current of the semiconductor device, and
    a second constant current source configured to limit a current of second transistor.

3. The overheat protection circuit according to claim 2, wherein the output current detection circuit further includes a third transistor connected in parallel with the second transistor, the third transistor containing a gate supplied with a voltage corresponding to the overheat detection signal,
    wherein while the output circuit is supplying the overheat detection signal, the output current detection circuit turns ON the third transistor to control the gate voltage of the first transistor in such a manner that the first transistor supplies a prescribed current unrelated to the output current of the semiconductor device.

4. A semiconductor device comprising:
    an output transistor containing a gate;
    a drive circuit configured to supply a control voltage to the gate of the output transistor; and
    the overheat protection circuit according to claim I configured to control a gate voltage of the output transistor in accordance with the control voltage of the drive circuit.

* * * * *

UNITED STATES PATENT AND TRADEMARK OFFICE
CERTIFICATE OF CORRECTION

PATENT NO. : 11,387,825 B2
APPLICATION NO. : 16/689687
DATED : July 12, 2022
INVENTOR(S) : Kaoru Sakaguchi It is certified that error appears in the above-identified patent and that said Letters Patent is hereby corrected as shown below:

In the Claims

Column 10, Claim 2, Line 25, insert --the-- between "of" and "second".

Column 10, Claim 4, Line 42, delete "I" and replace with --1--.

Signed and Sealed this
Sixth Day of September, 2022

Katherine Kelly Vidal
*Director of the United States Patent and Trademark Office*